United States Patent
Kanaoka et al.

(10) Patent No.: US 7,372,797 B2
(45) Date of Patent: May 13, 2008

(54) DATA REPRODUCTION DEVICE

(75) Inventors: Toshikazu Kanaoka, Kawasaki (JP); Masakazu Taguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 503 days.

(21) Appl. No.: 10/628,687

(22) Filed: Jul. 28, 2003

(65) Prior Publication Data
US 2004/0057268 A1   Mar. 25, 2004

(30) Foreign Application Priority Data
Aug. 9, 2002   (JP) ............................... 2002-233869

(51) Int. Cl.
- G11B 5/09 (2006.01)
- G11B 20/10 (2006.01)
- G11B 7/00 (2006.01)

(52) U.S. Cl. ............................... 369/59.22; 369/59.21; 369/47.18; 369/47.28; 369/124.05

(58) Field of Classification Search ............ None
See application file for complete search history.

(56) References Cited

U.S. PATENT DOCUMENTS

| | | | |
|---|---|---|---|
| 4,121,165 A * | 10/1978 | Dogliotti et al. | 329/361 |
| 4,519,056 A * | 5/1985 | Kimoto et al. | 369/43 |
| 5,440,532 A * | 8/1995 | Yokogawa et al. | 369/47.18 |
| 5,657,318 A * | 8/1997 | Ohmori et al. | 370/516 |
| 5,946,359 A * | 8/1999 | Tajiri et al. | 375/331 |
| 5,963,525 A * | 10/1999 | Audoin et al. | 369/59.22 |
| 6,055,119 A * | 4/2000 | Lee | 360/51 |
| 6,671,244 B2 * | 12/2003 | Honma | 369/59.22 |
| 6,674,707 B2 * | 1/2004 | Ogura et al. | 369/59.22 |
| 6,934,229 B2 | 8/2005 | Fujiwara | 369/47.28 |
| 7,095,803 B2 * | 8/2006 | Gazsi et al. | 375/316 |
| 2002/0159350 A1 * | 10/2002 | Ogura et al. | 369/47.35 |

FOREIGN PATENT DOCUMENTS

| | | |
|---|---|---|
| JP | 06-243596 | 9/1994 |
| JP | 9-017130 | 1/1997 |
| JP | 09-270827 | 10/1997 |
| JP | 2001-338471 | 12/2001 |
| JP | 2002-216434 | 8/2002 |

\* cited by examiner

*Primary Examiner*—Wayne Young
*Assistant Examiner*—Parul Gupta
(74) *Attorney, Agent, or Firm*—Greer, Burns & Crain, Ltd.

(57) ABSTRACT

A data reproduction device for sampling a signal reproduced from a recording medium based on a synchronization clock signal synchronized with the reproduced signal includes: an analog-to-digital conversion part converting the reproduced signal into a first digital signal based on a first clock signal; an interpolation part interpolating the first digital signal so that the first digital signal is equalized with a second digital signal sampled based on a second clock signal having a frequency n times the frequency of the first clock signal; an optimum phase detection part receiving the output of the interpolation part and detecting the phase error between the optimum point of the reproduced signal and the synchronization clock signal; a phase correction part correcting the phase of the reproduced signal based on the phase error; and an information data start detection part detecting the start of information data based on the phase error.

17 Claims, 19 Drawing Sheets

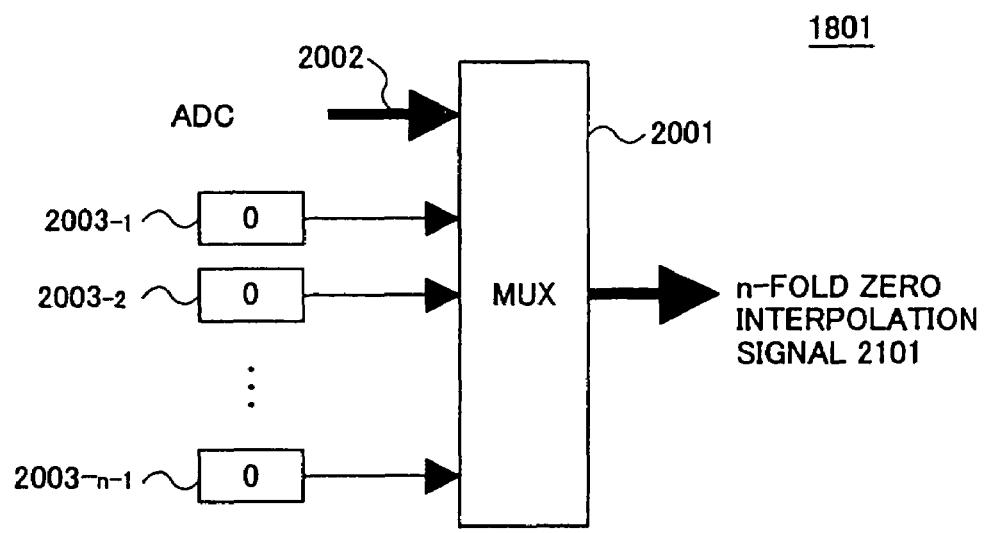
FIG.21
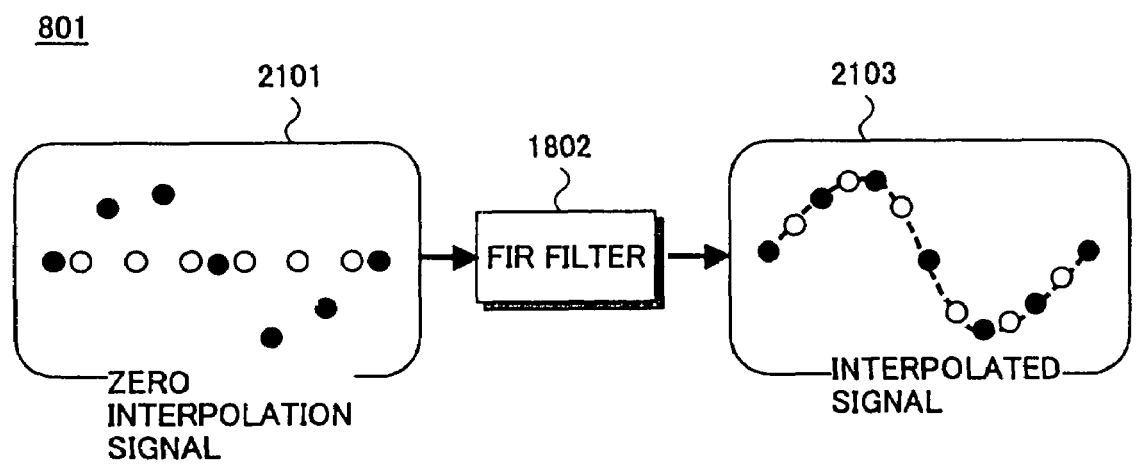

DATA REPRODUCTION DEVICE

BACKGROUND OF THE INVENTION

1. Field of the Invention

The present invention generally relates to data reproduction devices, and more particularly to a data reproduction device that can correct an optimum clock signal for sampling a reproduced signal.

2. Description of the Related Art

Data reproduction devices are widely used in data transmitting and receiving apparatuses for mobile phone or satellite communication and data recording and reproduction apparatuses for optical or magnetic disks. These devices are necessary for storing and transferring at high speed a large amount and a variety of information such as images and music.

In order to convert reproduced data into binary information data in a data reproduction apparatus such as a conventional optical or magnetic disk unit, first, it is necessary to reproduce a synchronization signal that indicates the start of the recorded data. The synchronization signal is reproduced using a phase-locked loop (PLL) circuit. The basic principle of the PLL is as follows. In the PLL, a voltage-controlled oscillator (VCO) generates a reference clock signal for digitizing a reproduced signal. Then, the phase of the clock signal and the phase of the reproduced signal are compared, and the phase of the clock signal is controlled so that a predetermined relationship is established between the phases of the clock signal and the reproduced signal.

FIG. 1 is a block diagram showing a data reproduction apparatus for optical disks including a conventional analog PLL for generating a clock signal synchronized with a reproduced signal. The data reproduction apparatus of FIG. 1 includes an optical head 102, an automatic gain control (AGC) and equalizer part 103, a conventional analog PLL 104, and a demodulator 120. The optical head 102 emits light to an optical disk 101 such as a magneto-optical disk, and converts the reflected light therefrom into an electrical signal. The AGC and equalizer part 103 receives the output signal of the optical head 102. The demodulator 120 demodulates the data reproduced by the PLL 104.

Further, the conventional analog PLL 104 includes an analog filter 105, an analog-to-digital (A/D) converter 106, a digital waveform equalizer (EQ) 107, a symbol determiner 108, a phase error detector 109, a digital-to-analog (D/A) converter 110, a loop filter 111, and a VCO 112.

Referring to FIG. 1, in the conventional analog PLL 104, the A/D converter 106 samples a reproduced signal 130 that has passed the analog filter 105 based on a clock signal output from the VCO 112. The reproduced signal 130 sampled by the A/D converter 106 is subjected to waveform equalization in the digital waveform equalizer 107. Then, the symbol determiner 108 determines the symbol of the reproduced signal 130. Next, the phase error detector 109 detects the phase error between the clock signal generated by the VCO 112 and the reproduced signal 130. Then, the D/A converter 110 converts the detected phase error to an analog phase error signal. Next, the oscillation clock frequency of the VCO 112 is controlled based on the analog phase error signal that has passed the loop filter 111. Thus, the output clock signal of the VCO 112 is controlled, while the A/D converter 106 again samples the reproduced signal 130 based on the output clock signal of the VCO 112. Through the repetition of this operation, the clock signal generated by the VCO 112 can gradually synchronize with the reproduced signal 130.

Next, FIG. 2 is a block diagram showing a data reproduction apparatus for optical disks including a conventional analog PLL employing a technique of using an external clock signal for synchronization (an external clock technique). In FIG. 2, the same elements as those of FIG. 1 are referred to by the same numerals. The data reproduction apparatus of FIG. 2 includes a conventional analog PLL 201 employing an external clock technique. The conventional analog PLL 201 includes the analog filter 105, the A/D converter 106, the digital waveform equalizer 107, the symbol determiner 108, the phase error detector 109, a fine clock mark (FCM) detector circuit 202, a PLL 203, and a delay circuit 204.

In contrast to the above-described self-clock technique employed for clock generation in the data reproduction apparatus of FIG. 1, which technique generates a clock signal for data reproduction from the reproduced signal of information data itself, the external clock technique generates a clock signal for data reproduction by synchronizing a PLL with the signal reproduced from special clock marks (FCM) embedded in the medium. In the configuration of FIG. 2, the FCM detector circuit 202 detects a clock mark reproduced signal 210. Then, the PLL 203 generates a clock signal that synchronizes with the FCM reproduced signal 210 detected by the FCM detector circuit 202.

According to the above-described external clock technique, the frequency information of the clock signal for data reproduction is obtainable using the clock marks as described above. Accordingly, there is the necessity of adjusting the phase error between the clock signal for data reproduction and the reproduced signal 130 which phase error results from the difference between a detection system for detecting the clock marks and a detection system for detecting the reproduced signal 130. In the configuration of FIG. 2, the delay circuit 204 adjusts this phase error.

In order to carry out the adjustment of this phase error in the configuration of FIG. 2, the delay circuit 204 delays the phase of the synchronizing clock signal based on the phase error obtained by the phase error detector 109, and supplies the phase-delayed clock signal to the A/D converter 106, which samples the reproduced signal 130 based on the supplied phase-delayed clock signal.

However, the above-described prior art has the following disadvantages.

Each of the above-described self-clock and external clock techniques requires a feedback loop. This makes it difficult to increase the speed of the clock signal for data reproduction at which speed the clock signal follows a variation in the reproduced signal 130. This also makes it difficult to increase data transfer rate. Further, there is a problem in that when the signal-to-noise (S/N) ratio is low, the deterioration of symbol determination error rate significantly affects the accuracy of phase adjustment and consequently prevents stable phase synchronization from being achieved.

Due to advanced data signal processing techniques such as the partial response maximum likelihood (PRML) technique, demodulation is now performable even at low S/N ratios. However, a decrease in the S/N ratio and an increase in the data transfer rate have made it difficult for the above-described prior-art PLLs to adjust the phase error between the clock signal for data reproduction and the reproduced signal with high accuracy. Further, a delay in the follow-up operation of the prior-art PLLs as well as the oscillation thereof due to the feedback loop have also made it difficult for the prior-art PLLs to correct the phase error at high speed.

Particularly in the case of applying an encoding/decoding technique called Turbo Coding, which has been recently proposed and employed in the field of telecommunications, to a data storage device, a higher recording density may be achieved than with the PRML technique. On the other hand, however, it has also become difficult, at the low S/N ratios resulting from the higher recording density, to synchronize the phases of the clock signal for data reproduction and the reproduced signal, and accurately detect an information data start mark (such as a synchronization signal) indicating the start of an information data region.

SUMMARY OF THE INVENTION

Accordingly, it is a general object of the present invention to provide a data reproduction device in which the above-described disadvantages are eliminated.

A more specific object of the present invention is to provide a data reproduction device capable of synchronizing the phases of the clock signal for data reproduction and the reproduced signal and detecting the information data start mark with accuracy even at the low S/N ratios resulting from the higher recording density.

Another more specific object of the present invention is to provide a data reproduction apparatus including such a data reproduction device.

The above objects of the present invention are achieved by a data reproduction device for sampling an analog signal reproduced from a recording medium based on a synchronization clock signal synchronized with the reproduced signal, the data reproduction device including: an analog-to-digital (A/D) conversion part that converts the reproduced signal into a first digital signal based on a first clock signal; an interpolation part that interpolates the first digital signal so that the first digital signal is equalized with a second digital signal sampled based on a second clock signal having a frequency n times a frequency of the first clock signal, the interpolation part providing an output based on the interpolation; an optimum phase detection part that is supplied with the output of the interpolation part and, based on the output, detects a phase error between an optimum point of the reproduced signal and the synchronization clock signal; a phase correction part that corrects a phase of the reproduced signal based on the phase error; and an information data start detection part that detects a start of information data based on the phase error.

According to an aspect of the present invention, there is provided a data reproduction apparatus including a data reproduction device, an optical head that emits light to a recording medium and converts light reflected therefrom into an electrical signal, an AGC and equalizer part that is supplied with the electrical signal output from the optical head and outputs an analog signal to the data reproduction device, and a demodulator that demodulates an output of the data reproduction device.

According to the present invention, compared with the prior-art technologies, the phase error between a clock signal for data reproduction and a reproduced signal can be corrected and the start of information data can be detected at high speed with high accuracy in data reproduction with a lower S/N ratio or a greater cross-talk effect, or in a system requiring higher data transfer.

BRIEF DESCRIPTION OF THE DRAWINGS

Other objects, features and advantages of the present invention will become more apparent from the following detailed description when read in conjunction with the accompanying drawings, in which:

FIG. 20 is a block diagram showing a configuration of the zero interpolation filter according to the present invention;

FIG. 21 is a conceptual diagram of the interpolation FIR filter of FIG. 17 according to the present invention.

DETAILED DESCRIPTION OF THE PREFERRED EMBODIMENTS

A description is given below, with reference to the accompanying drawings, of embodiments of the present invention.

Figure 2:
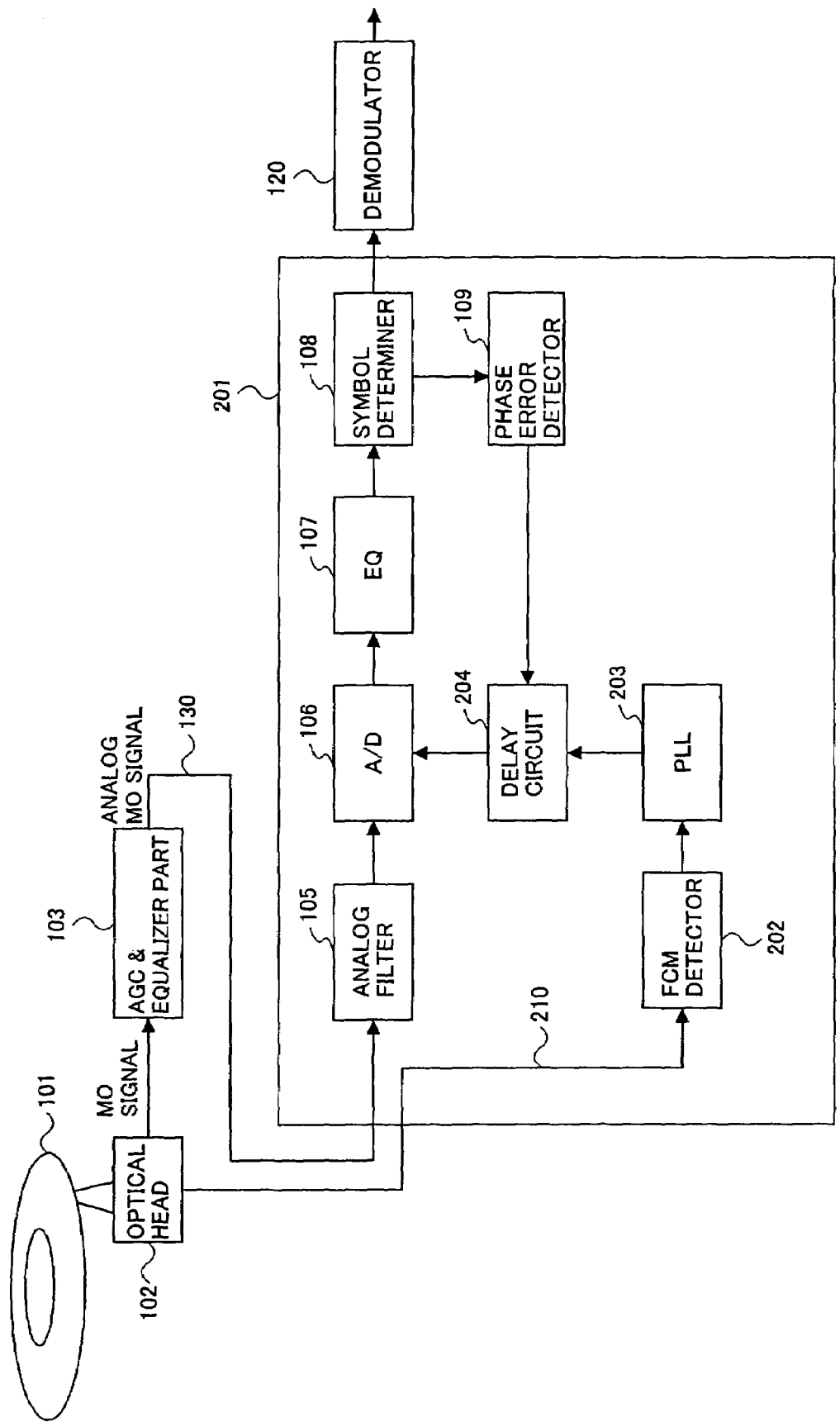
FIG. 2 is a block diagram showing a data reproduction apparatus for optical disks including another conventional analog PLL.
Figure 3:
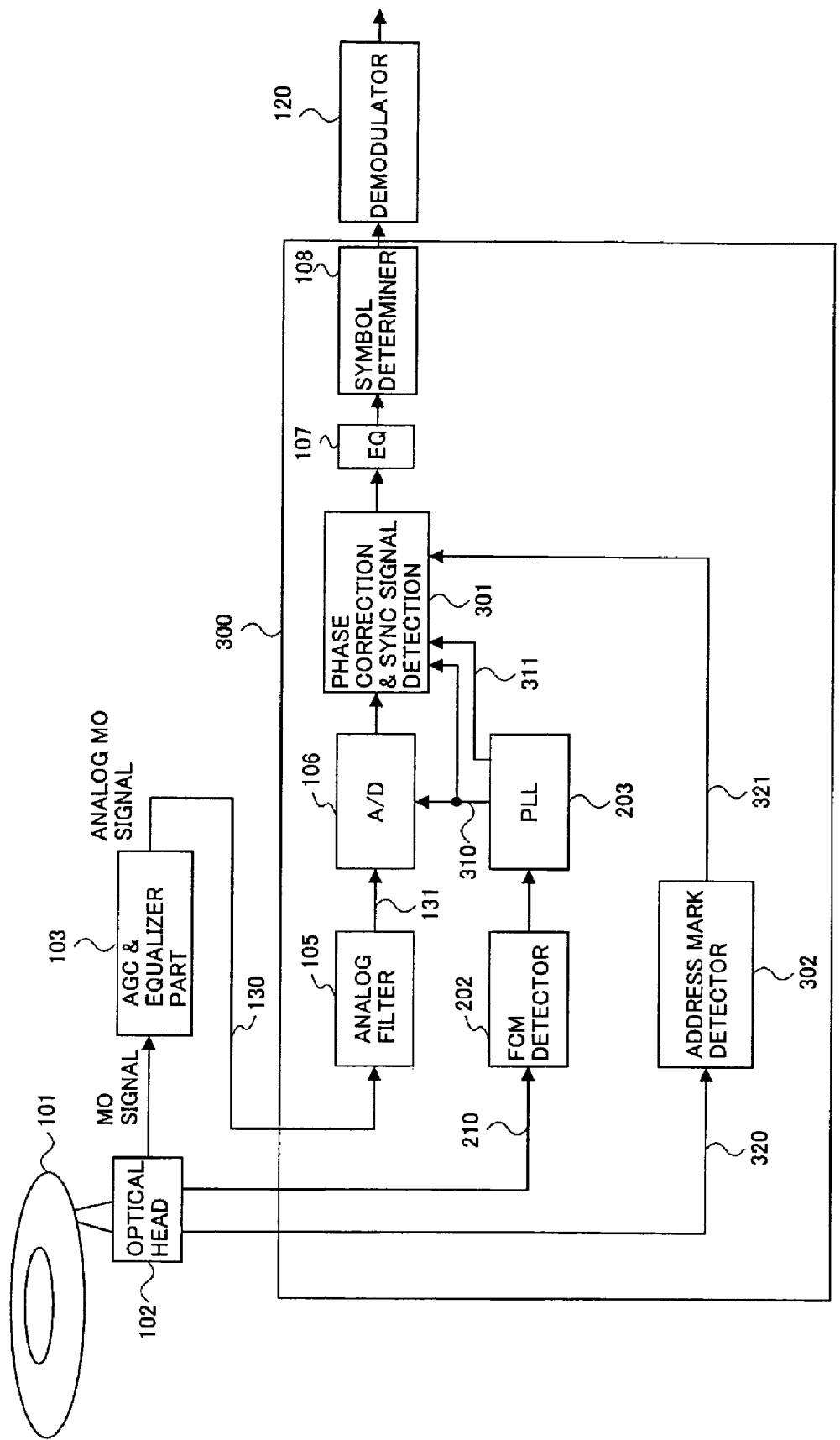
FIG. 3 is a diagram showing one embodiment of a data reproduction apparatus for optical disks including a data reproduction device using an external clock technique according to the present invention.
Figure 4:
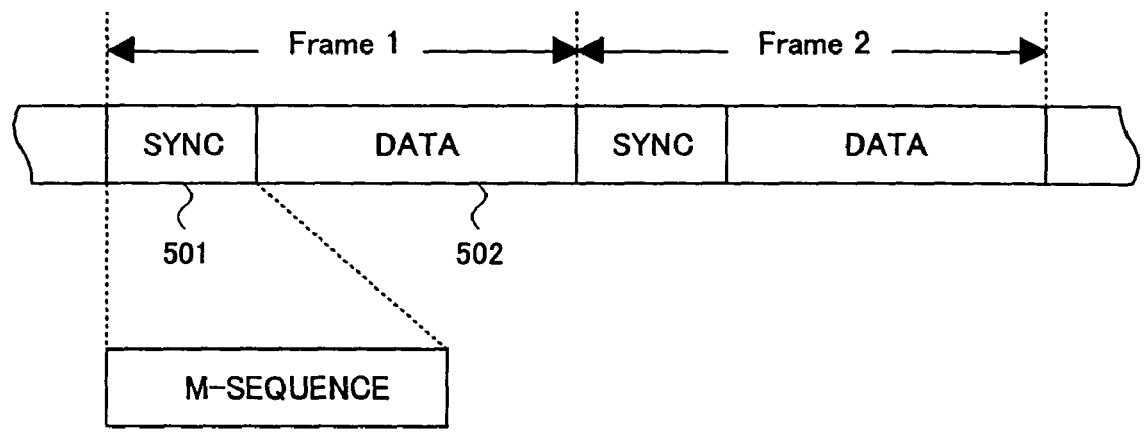
FIG. 4 is a diagram showing a format for recording a signal on an optical disk medium according to the present invention.

FIG. 3 is a diagram showing one embodiment of a data reproduction apparatus for optical disks including a data reproduction device (unit) 300 using the above-described external clock technique according to the present invention. FIG. 4 is a diagram showing a format for recording a signal on an optical disk medium according to the present invention. The data reproduction device 300 of FIG. 3 using the above-described external clock technique is employed instead of the conventional analog PLL 201 of FIG. 2. In FIG. 3, the same elements as those of FIG. 2 are referred to by the same numerals. The data reproduction device 300 includes the analog filter 105, the A/D converter 106, a phase correction and synchronization signal detection part 301, the digital waveform equalizer 107, the symbol determiner 108, the FCM detector circuit 202, the PLL 203, and an address mark detector 302.

In the data reproduction device 300, the FCM detector circuit 202 detects the FCM reproduced signal 210 of the clock marks (FCM) reproduced from the optical disk 101. The PLL 203 generates a synchronizing channel clock signal synchronized with the detected FCM reproduced signal 210, and supplies the synchronizing channel clock signal to the A/D converter 106 as a sampling clock signal 310. The synchronizing channel clock signal does not synchronize in phase with the information data reproduced signal 130. The A/D converter 106 samples a reproduced signal 131 output from the analog filter 105 based on the sampling clock signal (having a frequency equal to or a few times the frequency of the synchronizing channel clock signal).

The address mark detector 302 generates a phase comparison gate (cross-correlation comparison gate) 321 based on a reproduced address signal 320. The phase correction and synchronization signal detection part 301 corrects the phase of the sampled values of the sampled reproduced signal 131 within the cross-correlation comparison gate 321 so that the phase may be the same as if the reproduced signal 131 were sampled at optimum points. Then, the phase correction and synchronization signal detection part 301 transmits only the data part of the sampled reproduced signal 131. The output of the phase correction and synchronization signal detection part 301 is subjected to waveform equalization in the digital waveform equalizer 107, and then has its symbol determined by the symbol determiner 108.

Figure 5:
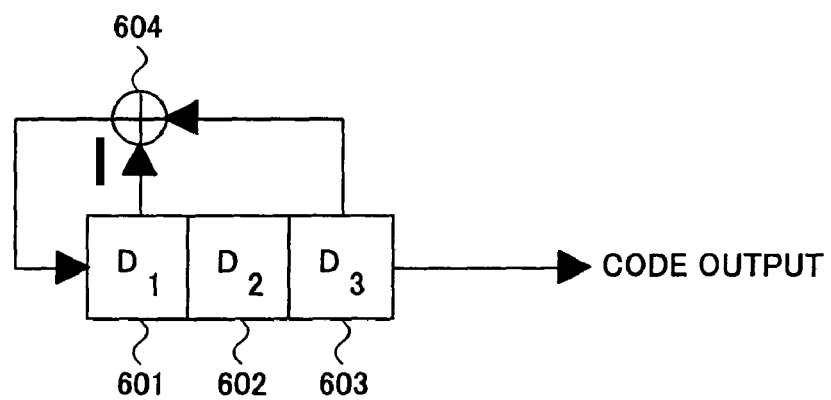
FIG. 5 is a diagram showing an M-sequence generator according to the present invention.

According to the format for recording a signal on an optical disk medium shown in FIG. 4, each frame (Frame 1, for instance) is composed of a synchronization signal (SYNC) region 501 and a data (DATA) region 502. Referring to FIG. 4, the SYNC region 501 serves as a phase detection region and an information data start detection region. In the format of FIG. 4, the SYNC region 501 is composed of a maximal sequence (M-sequence) signal. However, the phase detection region and the information data start detection region may be formed as separate regions. A feedback loop is selected independently for each track so as to reduce the correlation between an M-sequence signal recorded in one track and an M-sequence signal recorded in a track adjacent thereto. FIG. 5 is a diagram showing an M-sequence generator of three stages, a code length of 7, and a [3,1] feedback loop according to the present invention. The M-sequence generator of FIG. 5 includes shift registers 601, 602, and 603 in three stages and an exclusive OR gate 604. Letting the initial values of $D_1$, $D_2$, and $D_3$ be 1, 1, and 1, respectively, the M-sequence generator of FIG. 5 outputs a code of 11101001110100 . . . .

Figure 6:
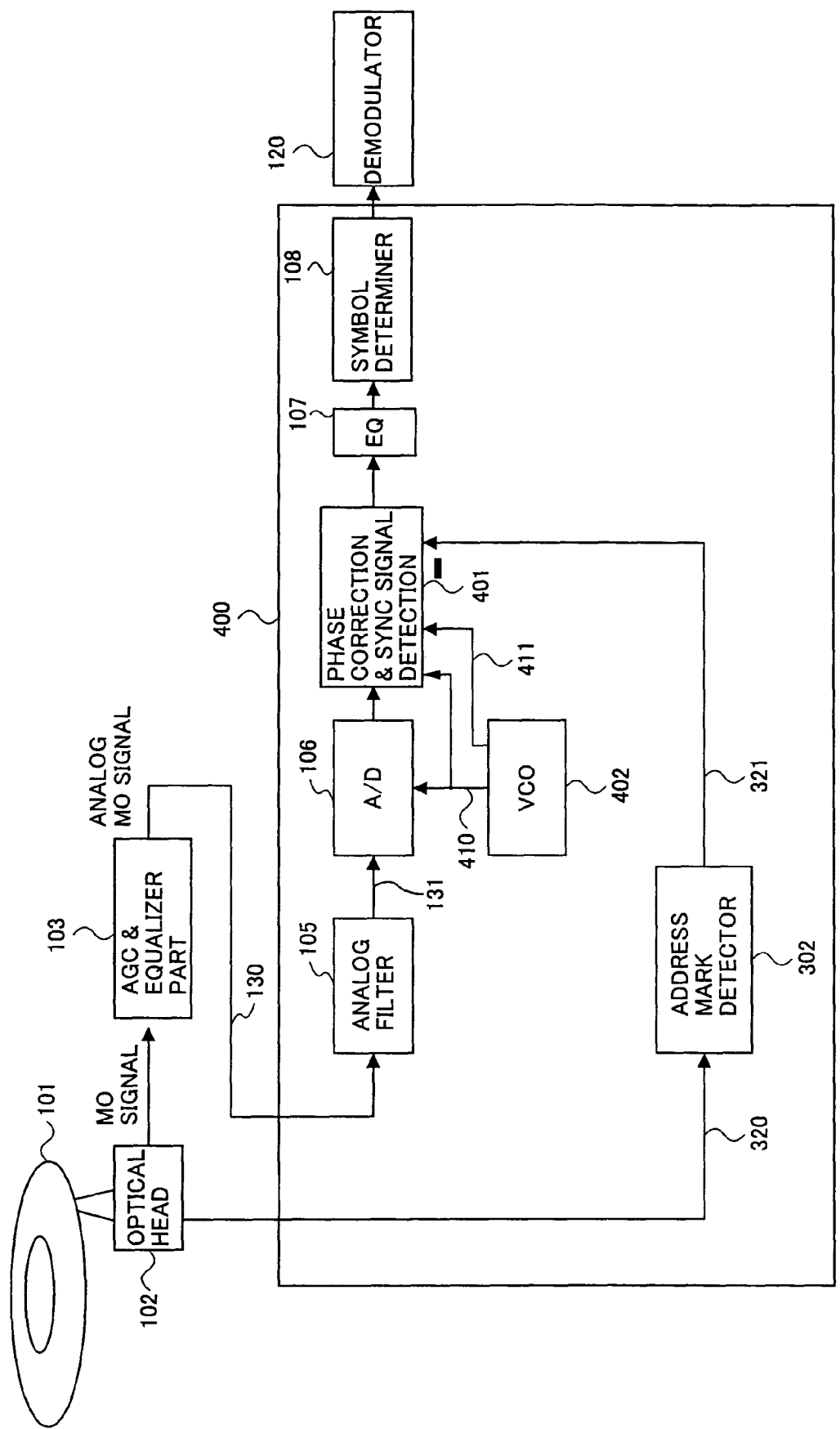
FIG. 6 is a block diagram showing one embodiment of a data reproduction apparatus for optical disks including a data reproduction device using another external clock technique according to the present invention.
Figure 7:
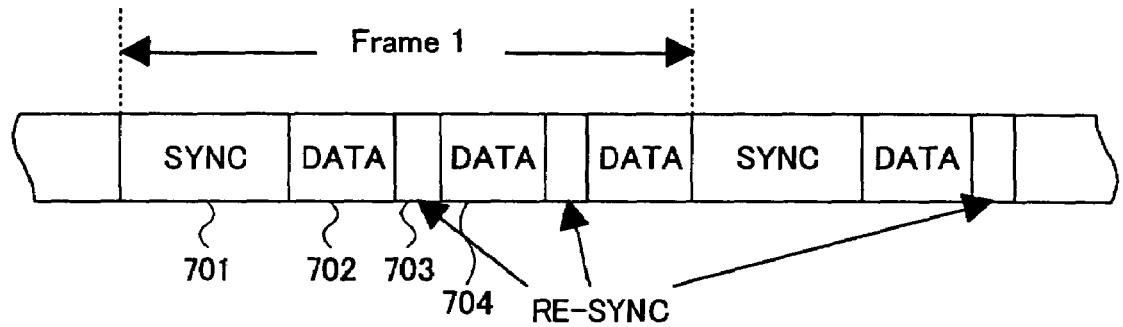
FIG. 7 is a diagram showing another format for recording a signal on an optical disk medium according to the present invention.

Next, FIG. 6 is a block diagram showing one embodiment of a data reproduction apparatus for optical disks including a data reproduction device (unit) 400 using an internal clock signal according to the present invention. That is, any of the internal and external clock signals may be employed in the present invention. FIG. 7 is a diagram showing another format for recording a signal on an optical disk medium according to the present invention.

Figure 1:
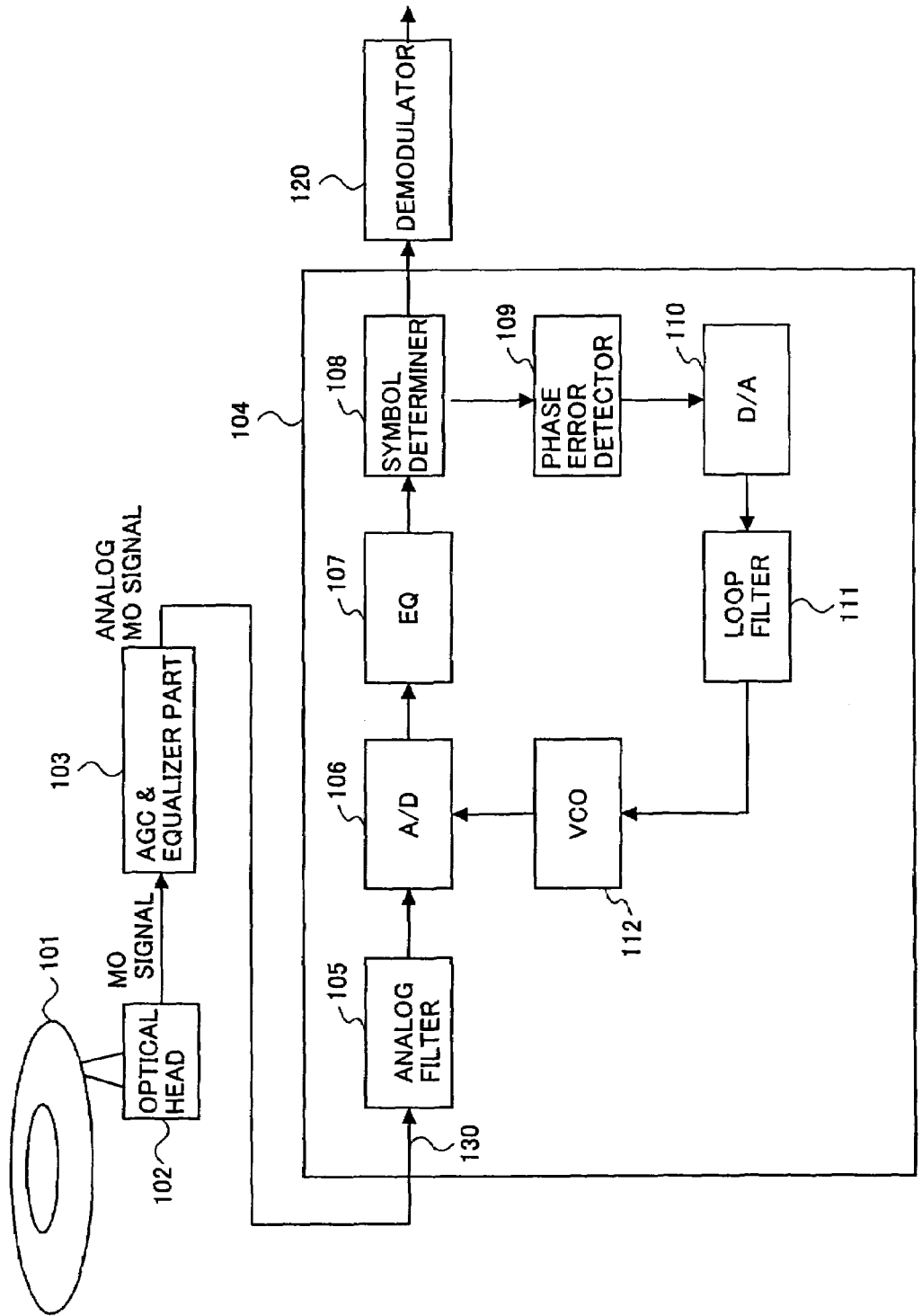
FIG. 1 is a block diagram showing a data reproduction apparatus for optical disks including a conventional analog PLL.

The data reproduction device 400 includes the analog filter 105, the A/D converter 106, a phase correction and synchronization signal detection part 401, the digital waveform equalizer 107, the symbol determiner 108, a VCO 402, and the address mark detector 302. In contrast to the conventional analog PLL 104 of the data reproduction apparatus of FIG. 1, in the data reproduction device 400, a clock signal 410 having an appropriate frequency (recorded clock frequency) is generated at discretion by the VCO 402 in advance, and the A/D converter 106 samples the reproduced signal 131 output from the analog filter 105 based on the clock signal 410.

The address mark detector 302 generates the cross-correlation comparison gate 321 based on the reproduced address signal 320. The phase correction and synchronization signal detection part 401 corrects the phase of the sampled values of the sampled reproduced signal 131 within the cross-correlation comparison gate 321 so that the phase may be the same as if the reproduced signal 131 were sampled at optimum points. Then, the phase correction and synchronization signal detection part 401 transmits only the data part of the sampled reproduced signal 131. The output of the phase correction and synchronization signal detection part 301 is subjected to waveform equalization in the digital waveform equalizer 107, and then has its symbol determined by the symbol determiner 108.

According to the format for recording a signal on an optical disk medium shown in FIG. 7, each frame (Frame 1, for instance) is composed of a synchronization signal (SYNC) region 701, a data (DATA) region 702, and a plurality of sets of a re-synchronization signal (RE-SYNC) region 703 and a data (DATA) region 704. By employing the format structure as shown in FIG. 7, a large amount of phase error can be corrected as described above, and a slight difference in frequency generated thereafter can be corrected in the RESYNC region 703.

A description is given below of the phase correction and synchronization signal detection part employing the external clock technique according to the present invention.

Figure 8:
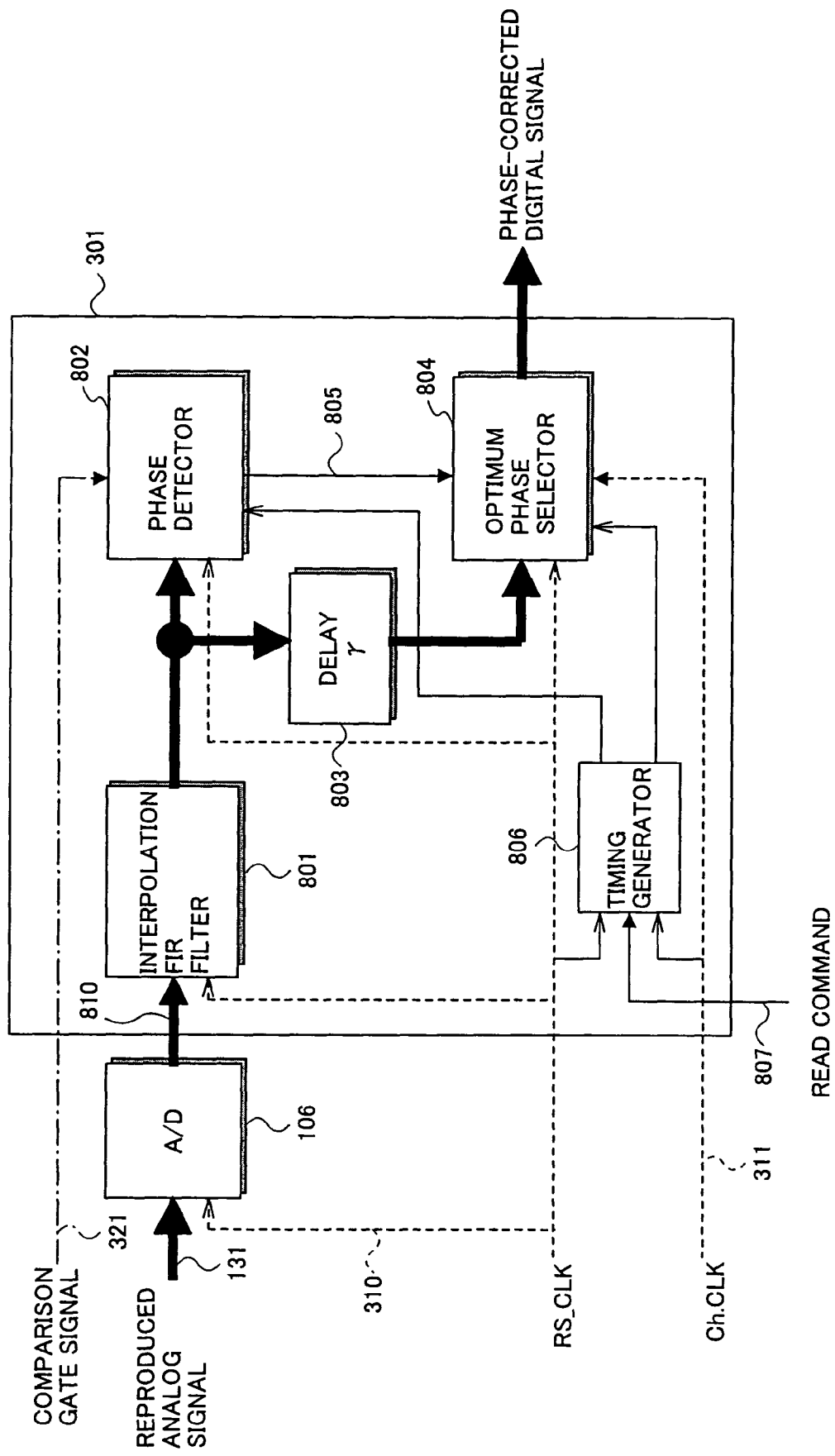
FIG. 8 is a block diagram showing an embodiment of a phase correction and synchronization signal detection part of the data reproduction device according to the present invention.

FIG. 8 is a block diagram showing an embodiment of the phase correction and synchronization signal detection part 301 of FIG. 3 and the phase correction and synchronization signal detection part 401 of FIG. 6. For convenience of description, the phase correction and synchronization signal detection part and the related elements of FIG. 8 are referred to by the corresponding reference numerals employed in FIG. 3. The phase correction and synchronization signal detection part 301 includes an interpolation FIR (finite impulse response) filter 801, a phase detector 802, a delay circuit 803, an optimum phase selector 804, and a timing generator 806. The timing generator 806 generates a timing signal necessary for the operation of each part of the phase correction and synchronization signal detection part 301 in accordance with a READ command 807 supplied from a host computer. Referring to FIG. 8, the sampling (re-sampling) clock signal (RS_CLK) 310 supplied to the A/D converter 106 has a frequency twice the frequency of the synchronizing channel clock signal (Ch.CLK) 311, and an interpolation factor n for interpolation in the interpolation FIR filter 801 is set to 10 (n=10). Further, each of the interpolation FIR filter 801 and the phase detector 802 has a parallel configuration.

Referring to FIG. 8, the A/D converter 106 samples the reproduced analog signal 131 output from the analog filter 105 of FIG. 3 based on the re-sampling clock signal RS_CLK 310, and outputs a sampled digital signal 810 to the interpolation FIR filter 801. The sampled digital signal 810 is then subjected to tenfold interpolation by the interpolation FIR filter 801. The output of the interpolation FIR filter 801 is supplied to the phase detector 802, and when the cross-correlation comparison gate signal 321 from the address mark detector 302 is input to the phase detector 802, the phase detector 802 outputs optimum phase information 805 to the optimum phase selector 804. Meanwhile, the output of the interpolation FIR filter 801 is delayed by the delay circuit 803. The optimum phase selector 804 selects an interpolation signal from the output of the delay circuit 803, and after correcting the phase of the interpolation signal, outputs only the data part of the phase-corrected interpolation (digital) signal.

Figure 9:
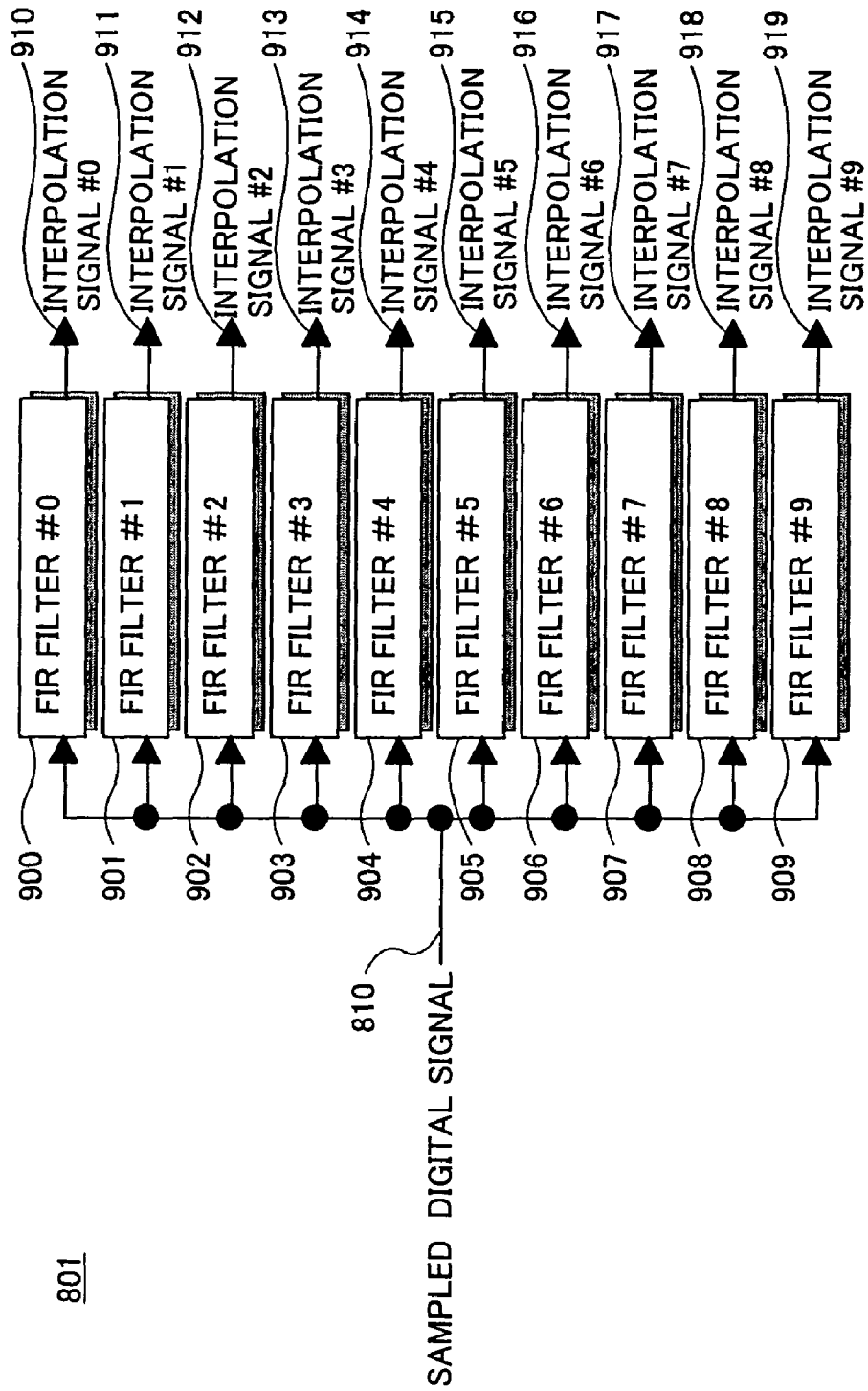
FIG. 9 is a block diagram showing an embodiment of an interpolation FIR filter of the phase correction and synchronization signal detection part according to the present invention.

Next, an explanation is given below of an operation of the phase correction and synchronization signal detection part 301 of FIG. 8. FIG. 9 is a block diagram showing an embodiment of the interpolation FIR filter having a parallel configuration. The interpolation FIR filter 801 of FIG. 9 is composed of ten FIR filters 900 through 909 arranged in parallel. The output 810 of the A/D converter 106 of FIG. 8 is input in parallel to the FIR filters 900 through 909. The FIR filters 900 through 909 output respective interpolation signals 910 through 919.

Figure 10:
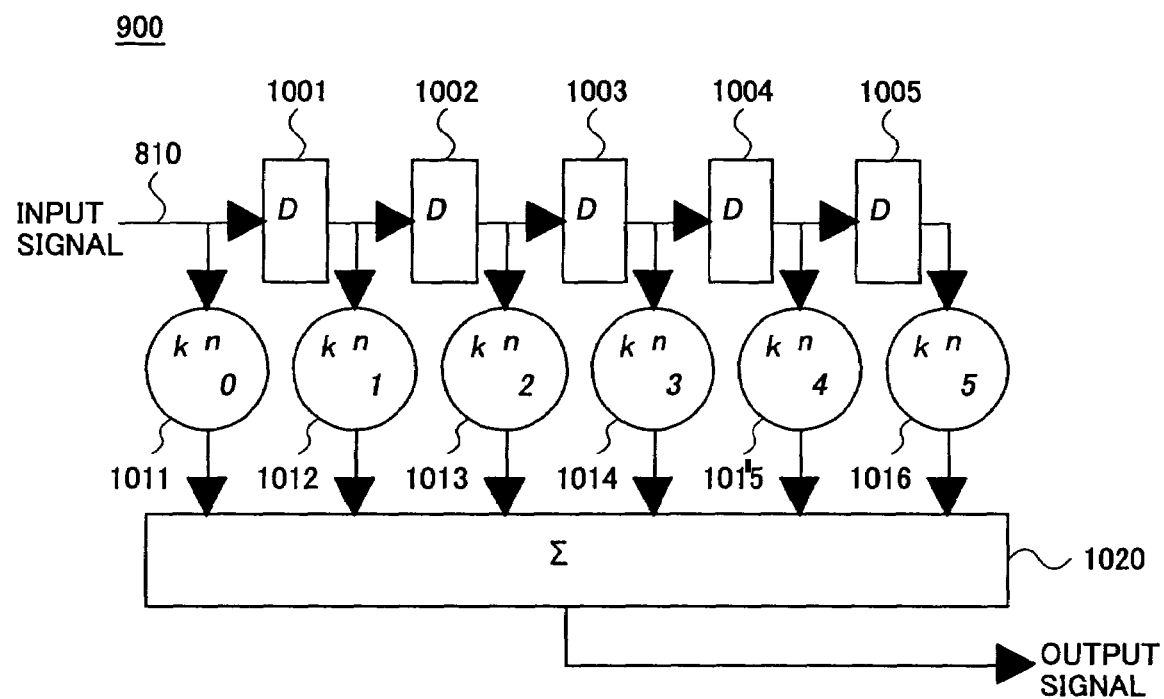
FIG. 10 is a block diagram showing a configuration of an FIR filter of the interpolation FIR filter according to the present invention.
Figure 11:
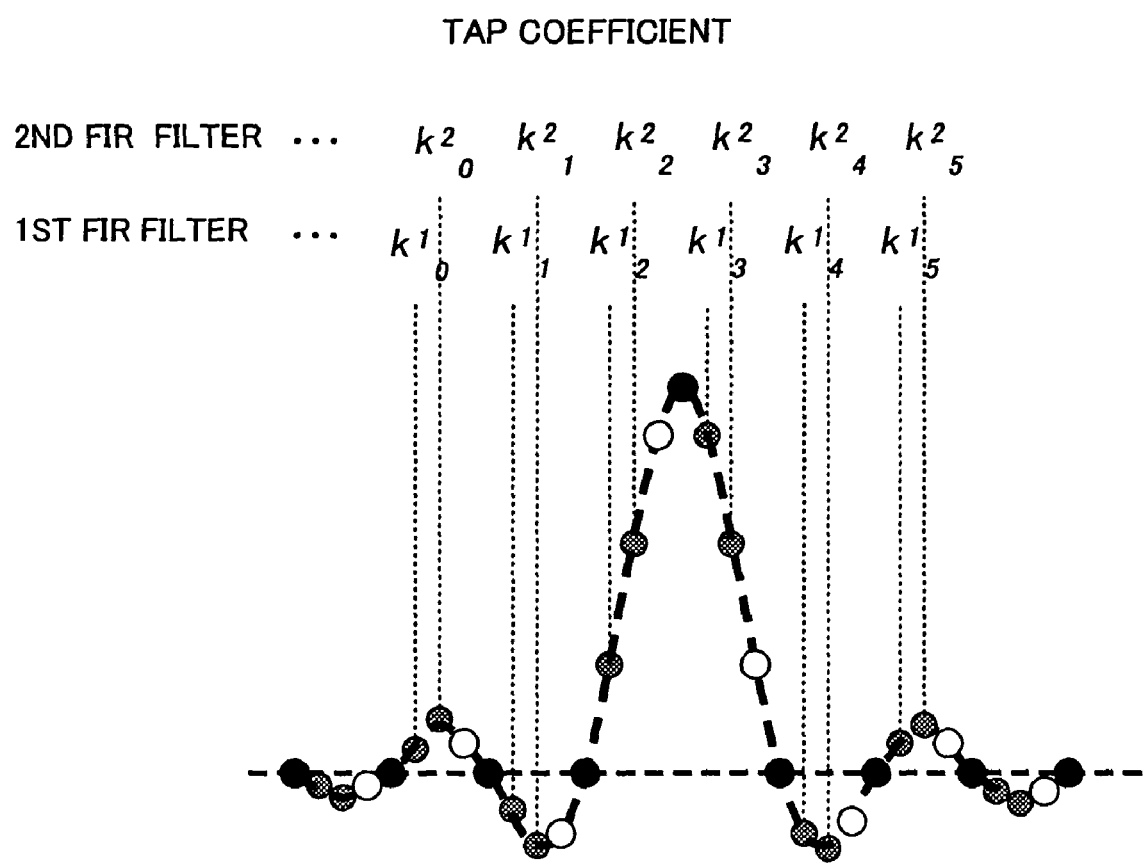
FIG. 11 is a diagram showing tap coefficients of the FIR filter according to the present invention.

FIG. 10 is a block diagram showing a configuration of any (900 being shown as an example) of the FIR filters 900 through 909 of FIG. 9. The FIR filter of FIG. 10 is composed of delay operators (D) 1001 through 1005 each representing a delay of one clock pulse, multipliers 1011 through 1016, and an adder 1020. FIG. 11 is a diagram showing the multipliers of the FIR filter of FIG. 10, which are the tap coefficients of the FIR filter.

In the embodiment of FIG. 8, the interpolation FIR filter 801 performs tenfold interpolation. However, in order to define the concept of interpolation, the tap coefficients of the FIR filter for fourfold interpolation are shown in FIG. 11. Those skilled in the art can understand the case of tenfold interpolation easily from the example of FIG. 11.

FIG. 11 shows the case where interpolation is performed based on a Nyquist waveform normalized to have a maximum value of 1. For convenience of description, the interpolation is fourfold interpolation. In FIG. 11, the circles indicate the sampled values of the Nyquist waveform in the case of sampling the Nyquist waveform based on a clock signal whose frequency is four times the frequency of a synchronization signal. The tap coefficients of a first FIR filter are formed by extracting every fourth sampled value of the Nyquist waveform. Next, the tap coefficients of a second FIR filter are formed by extracting the next sampled values to the tap coefficients of the first FIR filter. That is, the tap coefficients of the first FIR filter are $K^1_0$, $K^1_1$, $K^1_2$, $K^1_3$, $K^1_4$, and $K^1_5$, and the tap coefficients of the second FIR filter are $K^2_0$, $K^2_1$, $K^2_2$, $K^2_3$, $K^2_4$, and $K^2_5$. Thus, the tap coefficients of each parallel filter are determined. As previously described, tenfold interpolation is performed in the embodiment of FIG. 8. Therefore, the tap coefficients of the interpolation FIR filters 900 through 909 are determined by extracting every tenth sampled value. A typical Nyquist waveform is given by the following equation:

$$r(t) = \frac{\sin(\pi t/T)}{\pi t/T} \cdot \frac{\cos(\pi \beta t/T)}{1-(2\beta t/T)^2}$$

where $r(0) \neq 0$, $r(mT)=0$:$m=\pm 1, \pm 2, \Lambda$.

If the number of taps is six in the above-described equation, the tap coefficients are given as follows.

The tap coefficients $K^0_1$, $K^0_2$, $K^0_3$, $K^0_4$, and $K^0_5$ of the FIR filter 900 are $r(-2nT/n)$, $r(-nT/n)$, $r(0)$, $r(nT/n)$, $r(2nT/n)$, and $r(3nT/n)$.

The tap coefficients $K^1_1$, $K^1_2$, $K^1_3$, $K^1_4$, and $K^1_5$ of the FIR filter 901 are $r((-2n+1)T/n)$, $r((-n+1)T/n)$, $r(T/n)$, $r((n+1)T/n)$, $r((2n+1)T/n)$, and $r((3n+1)T/n)$.

The tap coefficients $K^{n-1}_1$, $K^{n-1}_2$, $K^{n-1}_3$, $K^{n-1}_4$, and $K^{n-1}_5$ of the FIR filter 900+(n−1) are $r((-2n+n-1)T/n)$, $r((-n+n-1)T/n)$, $r((n-1)T/n)$, $r((n+n-1)T/n)$, $r((2n+n-1)T/n)$, and $r((3n+n-1)T/n)$.

By thus providing FIR filters in parallel and changing the tap coefficients of each FIR filter, there may be no need of as many clock frequencies as the interpolation factor n. Further, in the case of performing interpolation based on a Nyquist waveform in which $r(0)=0$, $r(mT)=0$:$m=\pm 1, \pm 2, \ldots$, the FIR filter 900 is unnecessary, and the input signal 810 may be delayed for the period corresponding to the number of delay elements in the FIR filter.

Figure 12:
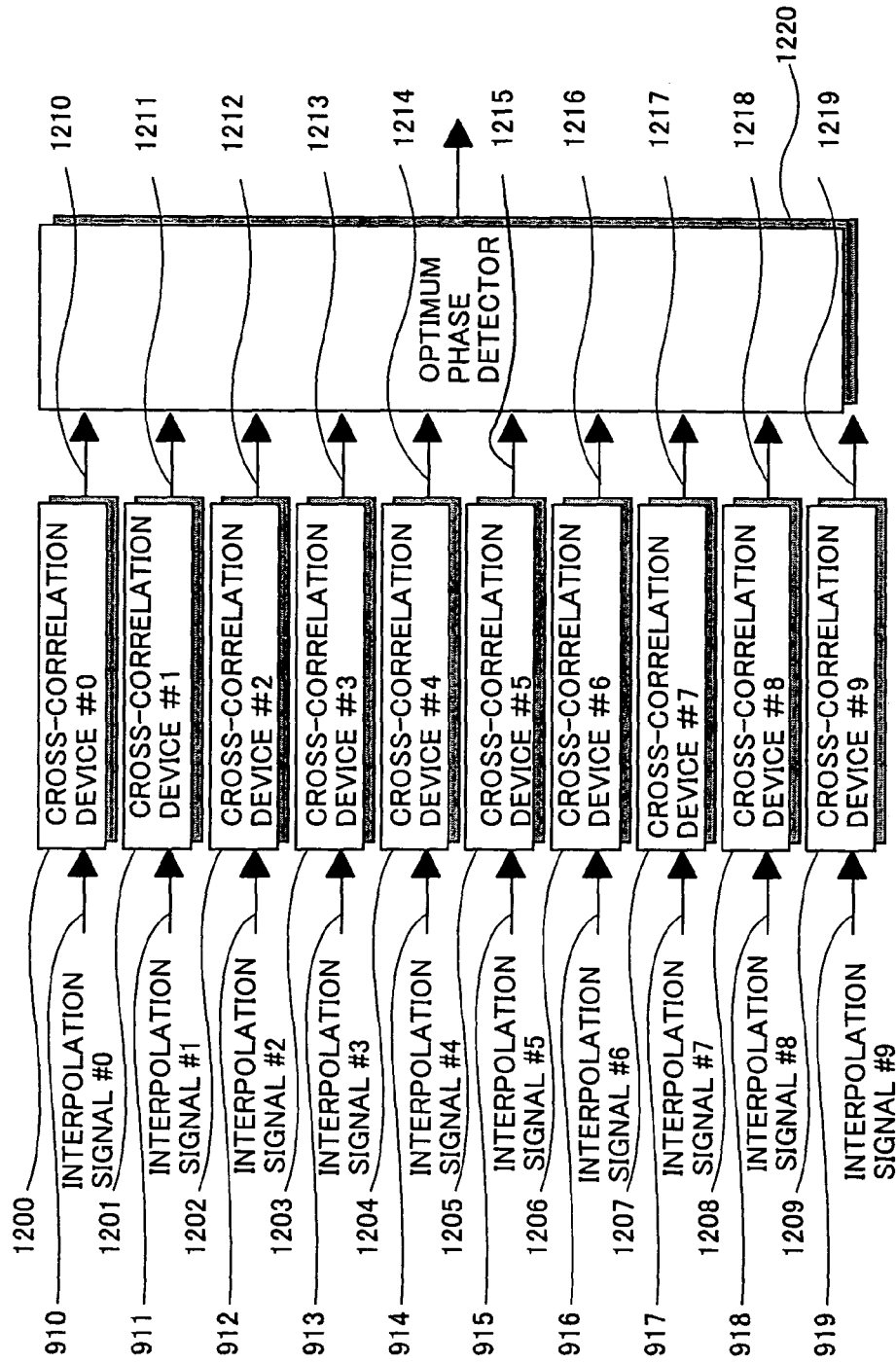
FIG. 12 is a block diagram showing an embodiment of a phase detector of the phase correction and synchronization signal detection part according to the present invention.
Figure 13:
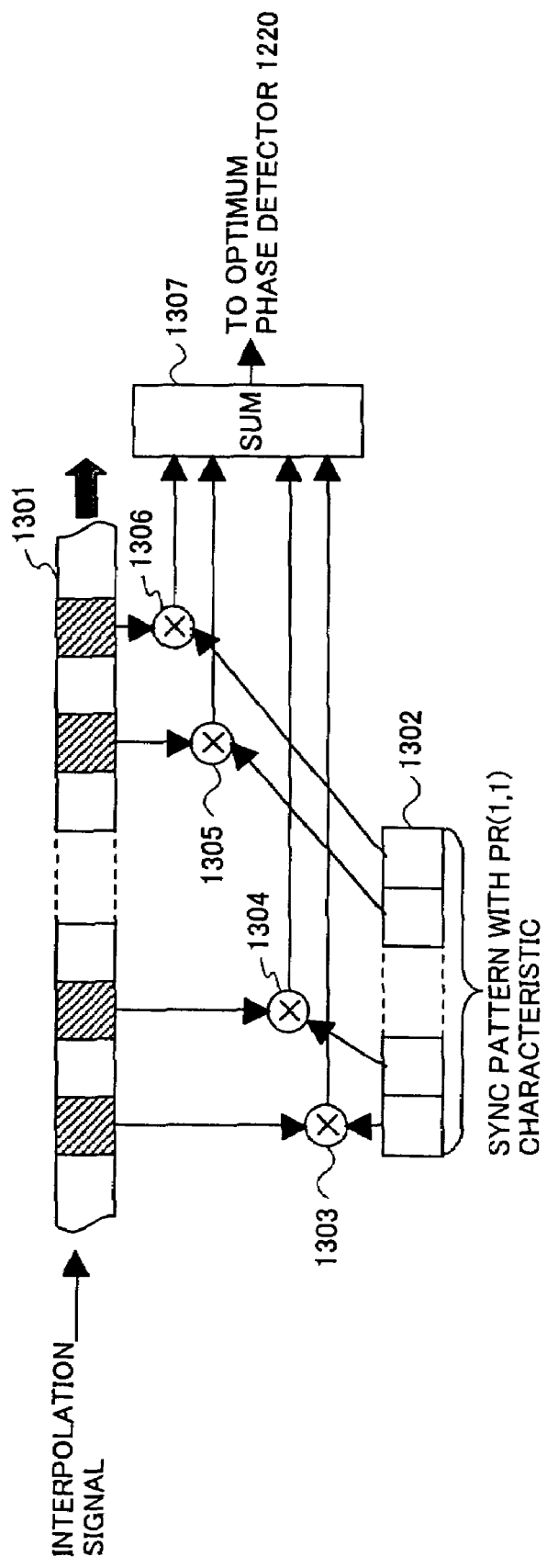
FIG. 13 is a diagram showing a configuration of a cross-correlation device of the phase detector according to the present invention.

Next, FIG. 12 is a block diagram showing an embodiment of the phase detector 802 having a parallel configuration. Referring to FIG. 12, the parallel-type phase detector 802 includes as many cross-correlation devices 1200 through 1209 arranged in parallel as the interpolation factor n (n=10 in FIG. 12), and an optimum phase detector 1220. The cross-correlation devices 1200 through 1209 output respective cross-correlation values 1210 through 1219. The interpolation signals 910 through 919 are input to the cross-correlation devices 1200 through 1209, respectively. FIG. 13 is a diagram showing a configuration of any of the cross-correlation devices 1200 through 1209. Each of the cross-correlation devices 1200 through 1209 performs a multiply-accumulate operation. The cross-correlation device of FIG. 13 includes a memory 1301 for storing the interpolation signal, a memory 1302 for storing a SYNC pattern provided with the PR(1,1) characteristic, multipliers 1301 through 1306, and an adder 1307. The PR(1,1) characteristic is a 1+D characteristic, and ideally, has the frequency response become zero at the frequency of a synchronization clock signal. Cross-correlation, which refers to performing a multiply-accumulate operation on two signals, is a technique of detecting the degree of resemblance of the two signals. According to the present invention, the cross-correlation between the interpolation signal and the known SYNC-region sequence (pattern) with the PR(1,1) characteristic, which is a recording and reproduction channel characteristic, is detected, so that the phase error is detected.

As shown in FIG. 13, when the frequency of the re-sampling clock signal RS_CLK 310 is twice the frequency of the synchronizing clock signal Ch.CLK 311, every other sampled value of the interpolation signal stored in the memory 1301 is multiplied by the corresponding value of the SYNC-region sequence stored in the memory 1302 in the corresponding one of the multipliers 1303 through 1306, and the products are summed in the adder 1307.

Figure 14:
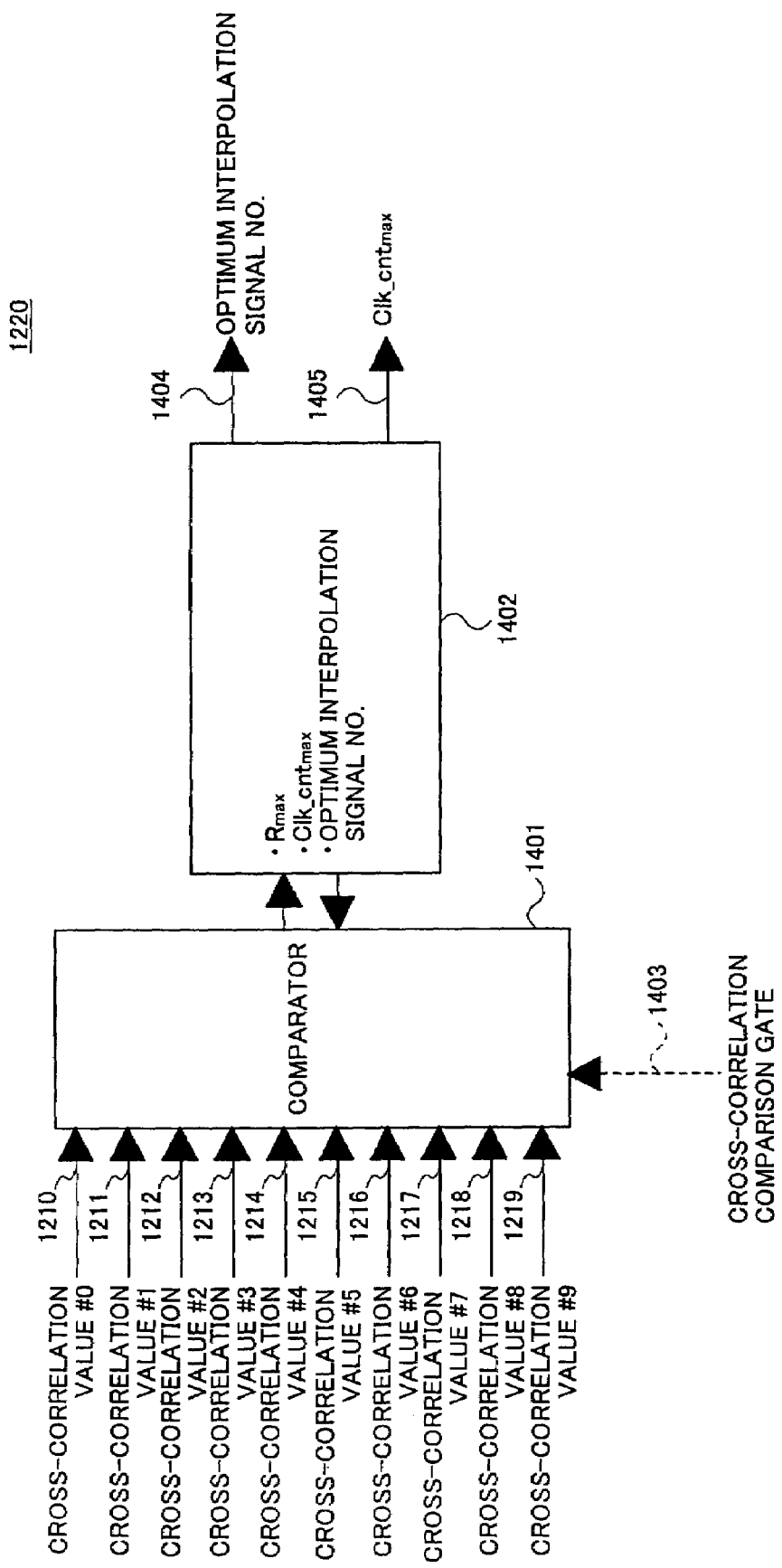
FIG. 14 is a block diagram showing an embodiment of an optimum phase detector of the phase detector according to the present invention.

FIG. 14 is a block diagram showing an embodiment of the optimum phase detector 1220 in the case of employing a parallel-type phase detector. The optimum phase detector 1220 includes a comparator 1401 and a storage block 1402. The comparator 1401 operates only when a cross-correlation comparison gate 1403 input from the timing generator 806 is asserted (that is, "ON" or opened) (during a γ clock-pulse period). The cross-correlation values 1210 through 1219 are input to the comparator 1401 every clock pulse. Then, the comparator 1401 compares the cross-correlation values 1210 through 1219 with a maximum cross-correlation value ($R_{max}$) (that is, the cross-correlation value of an optimum interpolation signal) stored in the storage block 1402. The storage block 1402 stores the stage number of the cross-correlation value (the number of the cross-correlation signal), the number of clock counts ($Clk\_cnt_{max}$) after the cross-correlation comparison gate 321 is asserted, and the cross-correlation value, respectively, of the optimum interpolation signal. That is, the stage number of the optimum cross-correlation value is the number of the optimum interpolation signal, and the number of clock counts $Clk\_cnt_{max}$ indicates an optimum phase position. Each time any of the cross-correlation values 1210 through 1219 input to the comparator 1401 is larger than the maximum cross-correlation value $R_{max}$ stored in the storage block 1402, the stage number of the cross-correlation value, the number of clock counts $Clk\_cnt_{max}$, and the maximum cross-correlation value $R_{max}$ stored in the storage block 1402 are updated. Then, finally, the storage block 1402 outputs the number of the optimum interpolation signal (a signal 1404) and the number of clock counts $Clk\_cnt_{max}$ (a signal 1405). The stored data are reset to predetermined initial values when the cross-correlation comparison gate 1403 is asserted.

Figure 15:
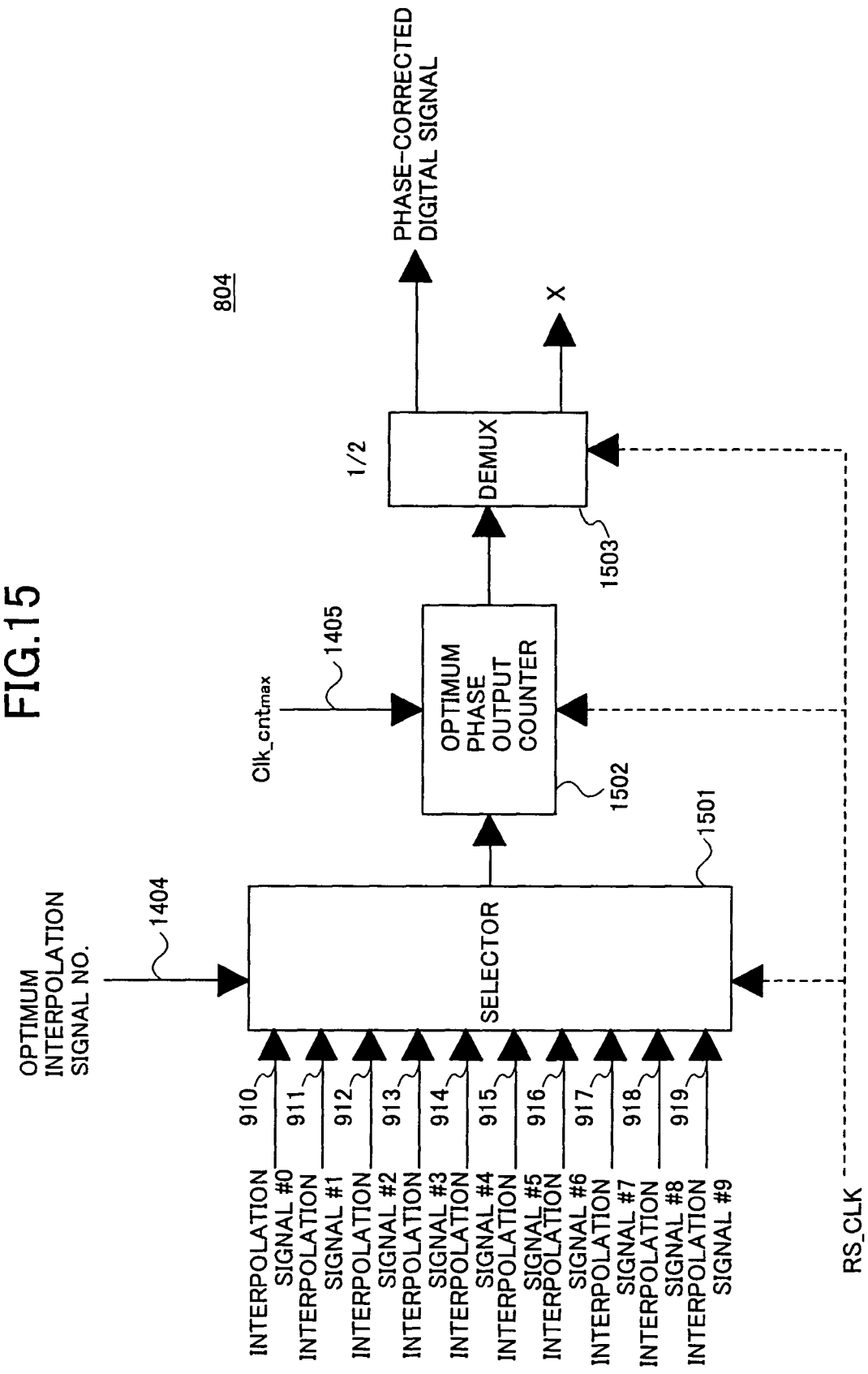
FIG. 15 is a block diagram showing an embodiment of an optimum phase selector of the phase correction and synchronization signal detection part according to the present invention.

Next, FIG. 15 is a block diagram showing an embodiment of the optimum phase selector 804. Referring to FIG. 15, the optimum phase selector 804 includes a selector 1501, an optimum phase output counter 1502, and a demultiplexer (DEMUX) 1503. The selector 1501 selects one of the n (n=10) interpolation signals 910 through 919 delayed for a period of γ clock pulses by the delay circuit 803 in accordance with the number 1404 of the optimum interpolation signal having an optimum phase supplied from the optimum phase detector 1220 of the phase detector 802. Then, the optimum phase output counter 1502 outputs only part of the selected one of the interpolation signals 910 through 919 after the point marked by the optimum phase position indicated by the $Clk\_cnt_{max}$ signal 1405. Then, the sampled values of the output signal of the optimum phase output counter 1502 are thinned out by half by the DEMUX 1503 (only the clock data of 0, 2, 4, 6, . . . are output from the DEMUX 1503). As a result, the information data is output accurately from the start thereof.

Thus, the clock signal for data reproduction and the reproduced signal can be synchronized in phase, the position of the information data start mark indicating the start of an information data region, such as a synchronization signal, may be detected with accuracy, and only the reproduced data may be output from the DEMUX 1503.

Figure 16:
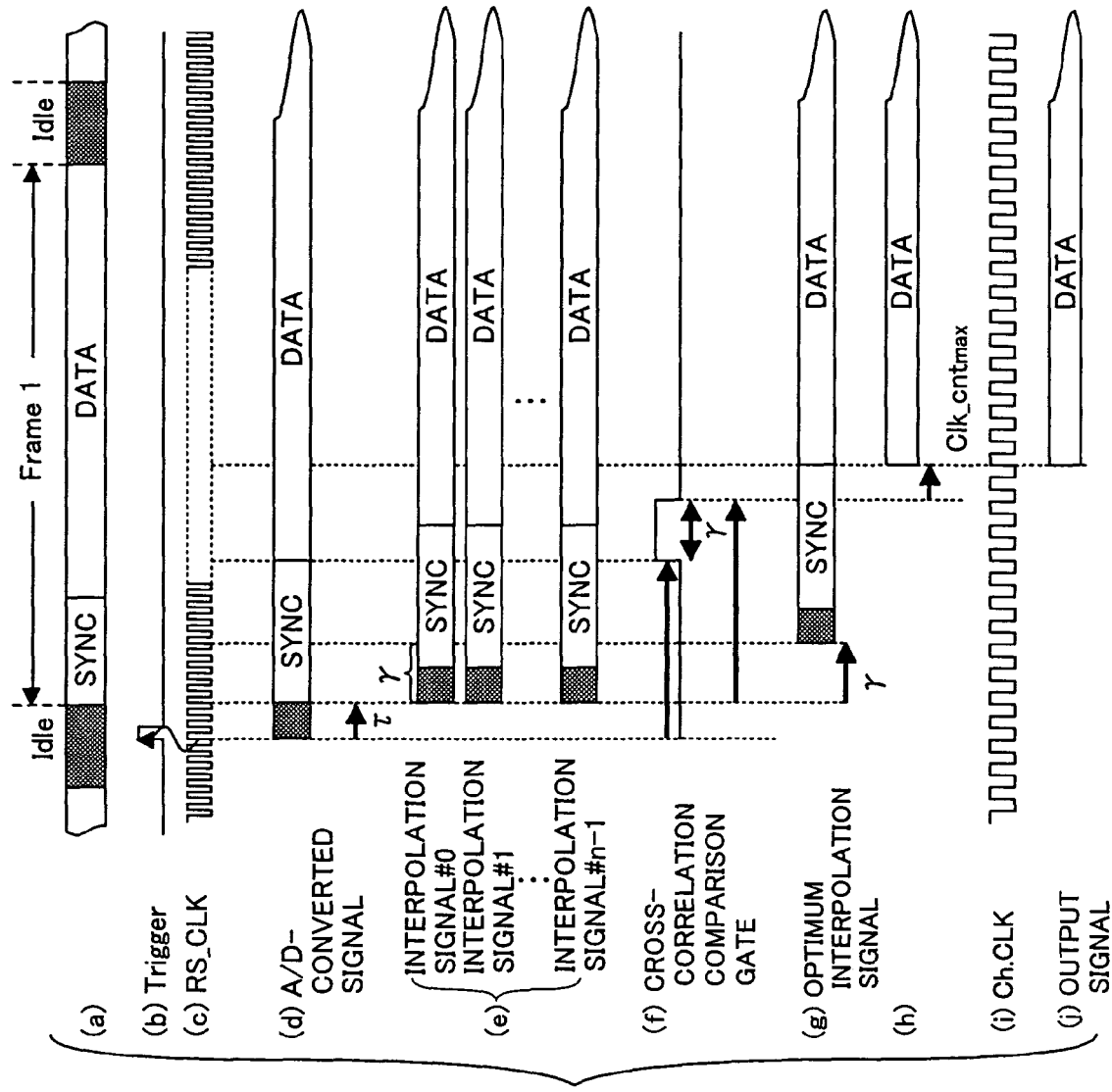
FIG. 16 is a timing chart of signals in the case of performing parallel processing in the interpolation FIR filter and the phase detector according to the present invention.

FIG. 16 is a timing chart of signals in the case of performing parallel processing in the interpolation FIR filter 801 and the phase detector 802. The timing chart of FIG. 16 shows the case of reproducing one frame.

Referring to FIG. 16, the frame (Frame 1) (FIG. 16(a)) is composed of the SYNC region 501 for detecting the start of data and a phase error, and the DATA region 502 as previously described with reference to FIG. 4.

When the READ command 807 is input from the host computer to the data reproduction apparatus for optical disks, a read gate trigger for information data reproduction rises (FIG. 16(b)). By this trigger, the A/D converter 106 starts sampling a reproduced signal based on the re-sampling clock signal RS_CLK (FIG. 16(c)) having a frequency x times the frequency of the synchronizing channel clock signal (Ch.CLK).

The A/D-converted signal (FIG. 16(d)) is subjected to interpolation by the interpolation FIR filter 801, and the interpolation signals (FIG. 16(e)) are output from the interpolation FIR filter 801. At this point, the interpolation signals are output, delayed for the period corresponding to the number of clock pulses T equal to the half of the number of delay elements of each FIR filter of the interpolation FIR filter 801. In FIG. 16(e), the period of γ clock pulses indicates a range within which the start of the SYNC signal is searched for. The cross-correlation comparison gate 321 output from the address mark detector 302 rises or gets asserted after the passage of a period of (SYNC length×x+τ) clock pulses since the rising of the read gate trigger, and remains asserted for a period of γ clock pulses (FIG. 16(f)). The comparator 1401 of the optimum phase detector 1220 of the phase detector 802 initializes the internal state of the storage part of the storage block 1402 when the cross-correlation comparison gate 321 gets asserted, and updates the storage part of the storage block 1402 while the cross-correlation comparison gate 321 remains asserted. When the cross-correlation comparison gate 321 falls or gets negated, the optimum phase information 805 composed of the number 1404 of the optimum interpolation signal and the number of clock counts $Clk\_cnt_{max}$ 1405 stored inside the phase detector 802 is supplied to the optimum phase selector 804. Then, the optimum phase selector 804 selects the optimum interpolation signal from the interpolation signals delayed for the period of γ clock pulses by the delay circuit 803 (FIG. 16(g)), and delays the optimum interpolation signal by the number of clock counts (pulses) $Clk\_cnt_{max}$ 1405 indicating the optimum phase position. Then, the DEMUX 1503 of the optimum phase selector 804 outputs only the DATA region 502 of the frame, the DATA region 502 synchronizing with the synchronizing channel clock signal Ch.CLK 311.

Figure 17:
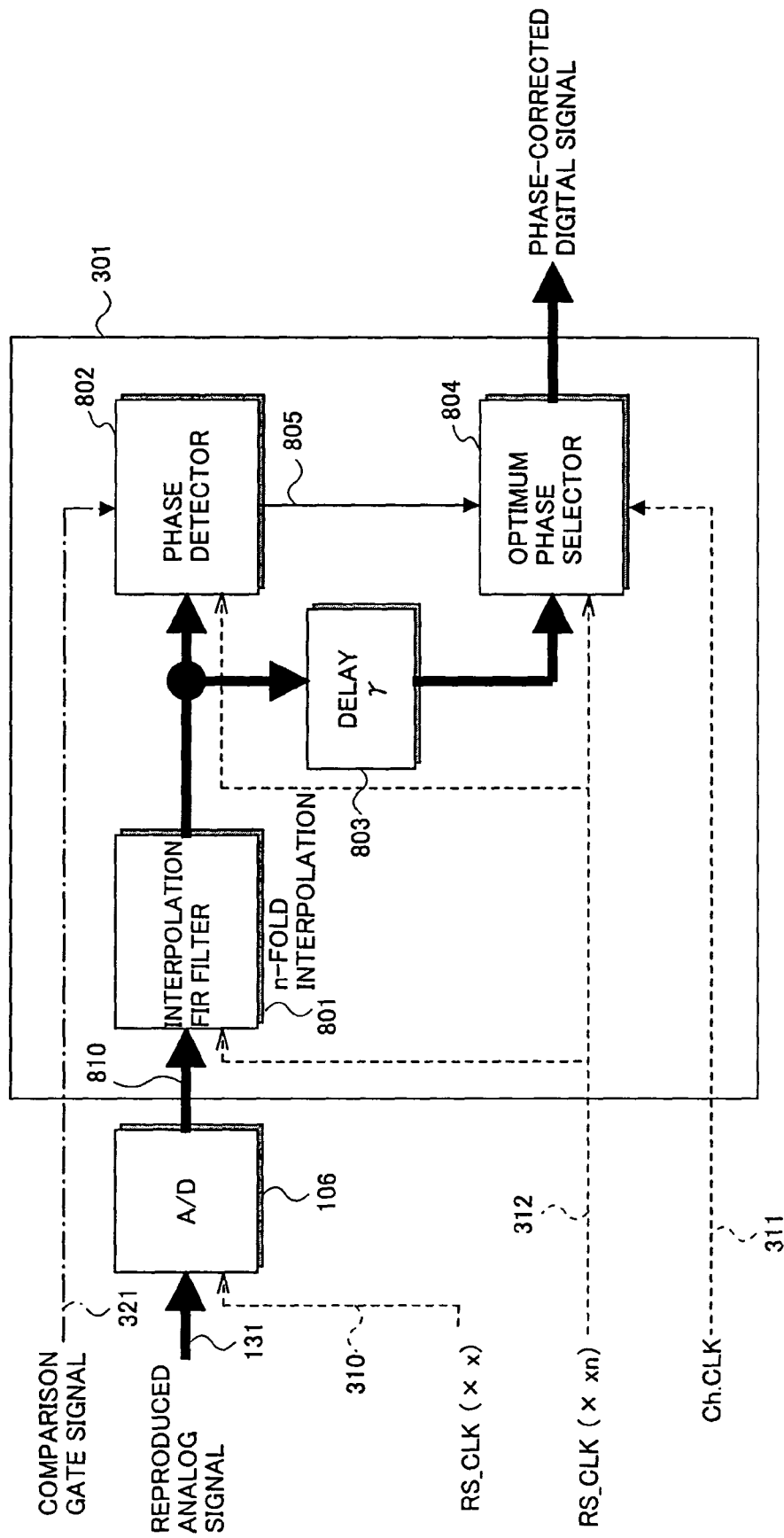
FIG. 17 is a diagram showing another embodiment of the phase correction and synchronization signal detection part according to the present invention.

Next, a description is given below, with reference to FIG. 17, of an embodiment of the phase correction and synchronization signal detection part 301 in the case of not performing parallel processing in the interpolation FIR filter 801 and the phase detector 802. In this case, the interpolation FIR filter 801 is a zero interpolation FIR filter. Referring to FIG. 17, the A/D converter 106 samples the reproduced signal 131 based on the re-sampling clock signal RS_CLK 310 having a frequency x times the frequency of the synchronizing channel clock signal Ch.CLK 311, and the zero interpolation FIR filter 801 and the phase detector 802 operate based on a re-sampling clock signal RS_CLK 312 having a frequency x×n times the frequency of the synchronizing channel clock signal Ch.CLK 311. The re-sampling clock signal RS_CLK 312 may also be generated in the PLL 203 of FIG. 3. In the optimum phase selector 804, only the optimum phase output counter 1502 performs processing based on the synchronizing channel clock signal Ch.CLK 311, and the other internal blocks perform processing based on the re-sampling clock signal RS_CLK 312.

Figure 18:
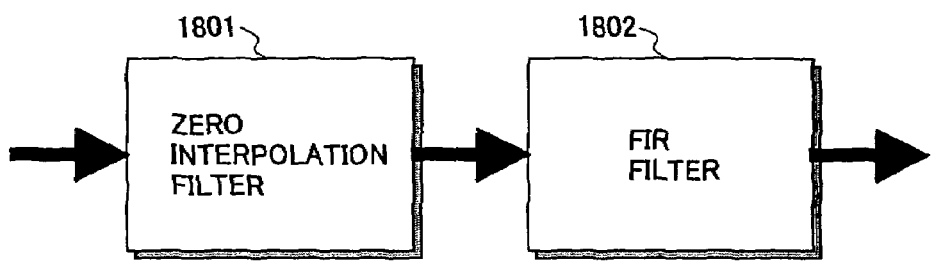
FIG. 18 is a block diagram showing a configuration of the interpolation FIR filter of the phase correction and synchronization signal detection part of FIG. 17 according to the present invention.

FIG. 18 is a block diagram showing a configuration of the (zero) interpolation FIR filter 801 of FIG. 17. As shown in FIG. 18, the interpolation FIR filter 801 includes a zero interpolation filter 1801 and an FIR filter 1802.

Figure 19:
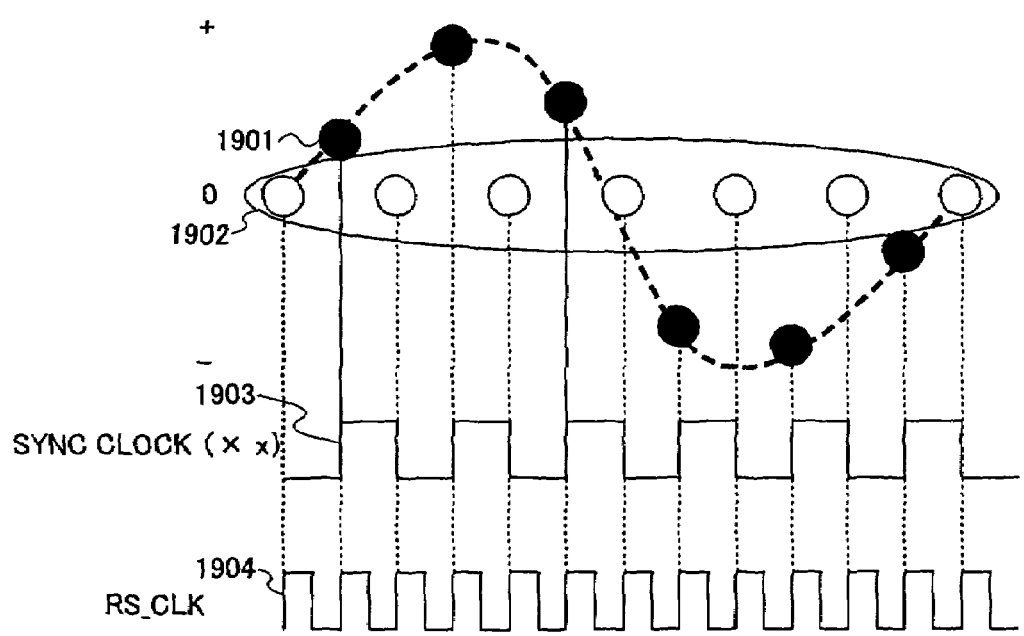
FIG. 19 is a conceptual diagram of a zero interpolation filter of the interpolation FIR filter of FIG. 18 according to the present invention.

FIG. 19 is a conceptual diagram of the zero interpolation filter. Referring to FIG. 19, the zero interpolation filter performs n-fold (twofold in the case of FIG. 19) interpolation by inserting a zero signal 1902 in a signal 1901 sampled based on a clock signal 1903 having a frequency x times the frequency of a synchronizing channel clock signal. A re-sampling clock signal RS_CLK 1904 is a clock signal having a frequency corresponding to the interpolated sampled signal.

FIG. 20 is a block diagram showing a configuration of the zero interpolation filter 1801. Referring to FIG. 20, the zero interpolation filter 1801 includes a multiplexer (MUX) 2001. The MUX 2001 combines n−1 "0" signals $2003_{-1}$ through $2003_{-n-1}$ with a signal 2002 output from the A/D converter 106, and outputs an n-fold zero interpolation signal 2101.

Figure 22:
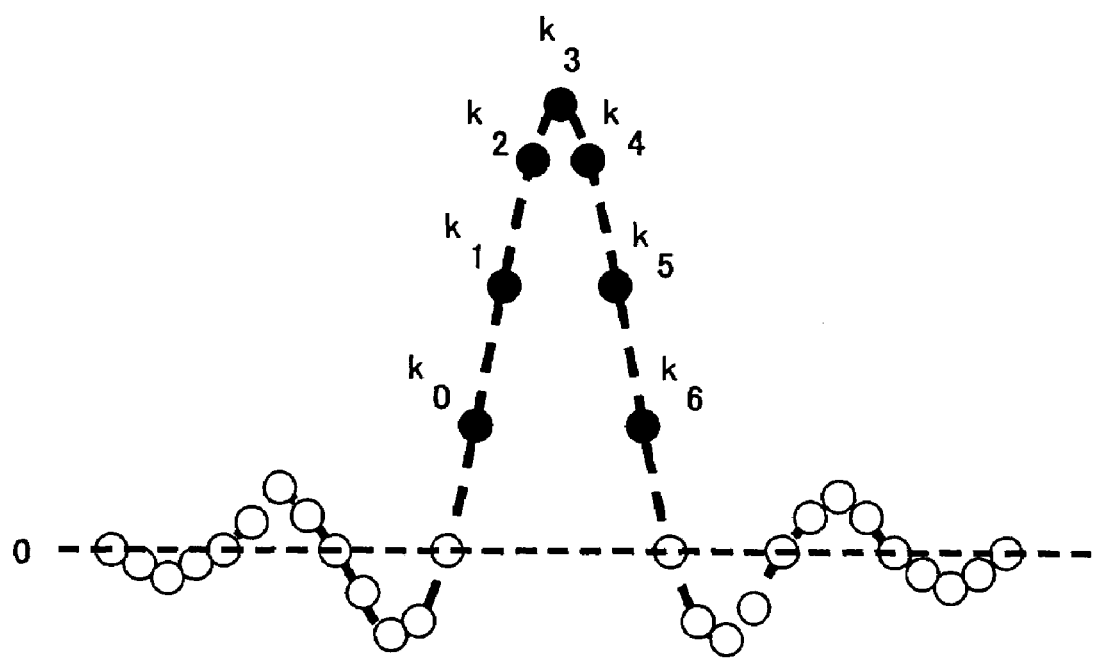
FIG. 22 is a diagram showing tap coefficients of an FIR filter of the interpolation FIR filter of FIG. 17 according to the present invention.

FIG. 21 is a conceptual diagram of the interpolation FIR filter 801 of FIG. 17. The n-fold zero interpolation signal 2101 output from the zero interpolation filter 1801 is passed through the FIR filter 1802, so that an interpolated signal 2103 is obtained. FIG. 22 is a diagram showing tap coefficients of the FIR filter 1802 of the interpolation FIR filter 801 of FIG. 17. In the case of performing interpolation based on the Nyquist function, the values k0, k1, k2, . . . of the Nyquist function at the time of dividing the frequency of a synchronizing channel clock signal n are successively employed as the tap coefficient as shown in FIG. 22. For instance, $$k_0 = r\left(-\frac{3}{n}T\right), k_1 = r\left(-\frac{2}{n}T\right), k_2 = r\left(-\frac{1}{n}T\right),$$

$$k_3 = r(0), k_4 = r\left(\frac{1}{n}T\right), k_5 = r\left(\frac{2}{n}T\right), \text{ and } k_6 = r\left(\frac{3}{n}T\right).$$

In FIG. 22 and the above-described equations, n=4.

By employing the configuration of FIG. 8, even with an S/N ratio 2 dB or more lower than conventionally, optimum phase correction and the detection of the start of information data can be performed with accuracy, and high data transfer rate can be achieved.

The present invention is not limited to the specifically disclosed embodiments, and variations and modifications may be made without departing from the scope of the present invention.

The present application is based on Japanese priority application No. 2002-233869, filed on Aug. 9, 2002, the entire contents of which are hereby incorporated by reference.

What is claimed is:

1. A data reproduction device sampling an analog signal reproduced from a recording medium based on a synchronization clock signal synchronized with the reproduced signal, the data reproduction device comprising:

an analog-to-digital (A/D) conversion part configured to convert the reproduced signal into a first digital signal based on a first clock signal;

an interpolation part configured to generate a plurality of interpolation signals and interpolate the first digital signal with the interpolation signals so that the first digital signal is equalized with a second digital signal sampled based on a second clock signal having a frequency a multiple of a frequency of the first clock signal;

an optimum phase detection part configured to be supplied with the interpolation signals from said interpolation part and, based on the supplied interpolation signals, detects a phase error between an optimum point of the reproduced signal and the synchronization clock signal;

a phase correction part configured to be supplied with the interpolation signals from the interpolation part and select one of the interpolation signals based on the phase error supplied from the optimum phase detection part, the one of the interpolation signals having an optimum phase with respect to the reproduced signal; and an information data start detection part that detects a start of information data based on the phase error.

2. The data reproduction device as claimed in claim 1, wherein the recording medium has recording tracks each having a phase detection region and an information data start detection region to which regions a predetermined pattern is written, and wherein the optimum phase detection part of the data reproduction device detects a phase error between an optimum point of the predetermined pattern and the synchronization clock signal.

3. The data reproduction device as claimed in claim 2, wherein a predetermined dedicated pattern is recorded in the phase detection region and the information data start detection region.

4. The data reproduction device as claimed in claim 2, wherein the phase detection region and the information data start detection region comprise a single region.

5. The data reproduction device as claimed in claim 2, wherein the predetermined pattern differs between adjacent recording tracks.

6. The data reproduction device as claimed in claim 1, wherein said interpolation part is an interpolation digital filter having coefficients substantially equal to an impulse response of a transmission characteristic of a signal recording and reproduction channel for the recording medium.

7. The data reproduction device as claimed in claim 1, wherein said interpolation part comprises a plurality of FIR filters arranged in parallel, the FIR filters each having a different set of coefficients.

8. The data reproduction device as claimed in claim 1, wherein said interpolation part interpolates the digital signal by linear interpolation that linearly divides the digital signal by an interpolation factor n.

9. The data reproduction device as claimed in claim 1, wherein the recording medium has recording tracks each having a phase detection region and an information data start detection region to which regions a predetermined pattern is written, and wherein:

said A/D conversion part converts the reproduced predetermined analog pattern into a first digital pattern based on the first clock signal;

said interpolation part interpolates the first digital pattern so that the first digital pattern is equalized with a second digital pattern sampled based on the second clock signal having the frequency a multiple of the frequency of the first clock signal; and said optimum phase detection part detects the optimum phase by performing a cross-correlation operation between the interpolated digital pattern and data obtained by weighting the predetermined pattern, which is to be written to the phase detection region and the information data start detection region of the recording medium, with coefficients substantially equal to an impulse response of a transmission characteristic of a signal recording and reproduction channel for the recording medium.

10. The data reproduction device as claimed in claim 9, wherein said optimum phase detection part comprises a cross-correlation part that performs the cross-correlation operation in parallel.

11. The data reproduction device as claimed in claim 9, wherein said optimum phase detection part comprises an optimum phase comparison and selection part, the optimum phase comparison and selection part comprising:

a storage part storing a maximum cross-correlation value, an optimum interpolation signal number, and an optimum phase position; and a comparison part that compares a new cross-correlation value obtained by the cross-correlation operation with the maximum cross-correlation value, and replaces the maximum cross-correlation value, the optimum interpolation signal number, and the optimum phase position stored in said storage part with the new cross-correlation value, and a new optimum interpolation signal number and a new optimum phase position corresponding to the new cross-correlation value, respectively, if the new cross-correlation value is larger than the maximum cross-correlation value.

12. The data reproduction device as claimed in claim 11, wherein said optimum phase comparison and selection part operates in accordance with a comparison gate.

13. The data reproduction device as claimed in claim 12, wherein the comparison gate is open for a period greater than or equal to a time length corresponding to the phase detection region and the information data start detection region, and is settable freely.

14. The data reproduction device as claimed in claim 12, wherein said storage part is set to predetermined initial values when the comparison gate opens, is allowed to update the maximum cross-correlation value, the optimum interpolation signal number, and the optimum phase position while the comparison gate is open, and retains the maximum cross-correlation value, the optimum interpolation signal number, and the optimum phase position while the comparison gate is closed.

15. The data reproduction device as claimed in claim 11, wherein:

said phase correction part comprises a selector configured to select the one of the interpolation signals supplied from said interpolation part in accordance with the stored or new optimum interpolation signal number output from said optimum phase detection part; and said information data start detection part comprises:

an optimum phase output counter that detects the start of the information data out of the selected one of the interpolation signals based on the stored or new optimum phase position output from said optimum phase detection part; and a signal selection part that re-samples the selected one of the interpolation signals into a signal synchronized with the synchronization clock signal.

16. The data reproduction device as claimed in claim 15, wherein:

said optimum phase output counter outputs only portion of the selected interpolation signal which part corresponds to the information data; and said signal selection part re-samples the output portion of the selected interpolation signal so that the re-sampled output portion synchronizes with the synchronization clock signal.

17. A data reproduction apparatus, comprising:

a data reproduction device as set forth in claim 1;

an optical head that emits light to the recording medium and converts light reflected therefrom into an electrical signal;

an AGC and equalizer part that is supplied with the electrical signal output from said optical head and outputs the analog signal to said data reproduction device; and a demodulator that demodulates an output of said data reproduction device.

* * * * *